(12) United States Patent
Freytag (10) Patent No.: US 12,019,129 B2
(45) Date of Patent: Jun. 25, 2024

(54) NMR PROBEHEAD

(71) Applicant: Bruker Switzerland AG, Fällanden (CH)

(72) Inventor: Nicolas Freytag, Binz (CH)

( * ) Notice: Subject to any disclaimer, the term of this patent is extended or adjusted under 35 U.S.C. 154(b) by 0 days.

(21) Appl. No.: 18/344,157

(22) Filed: Jun. 29, 2023

(65) Prior Publication Data

US 2024/0004012 A1 Jan. 4, 2024

(30) Foreign Application Priority Data

Jul. 1, 2022 (DE) .............................. 102022206766

(51) Int. Cl.
*G01R 33/38* (2006.01)
*G01R 33/385* (2006.01)

(52) U.S. Cl.
CPC .................................. *G01R 33/385* (2013.01)

(58) Field of Classification Search
CPC .................................................. G01R 33/385
See application file for complete search history.

(56) References Cited

U.S. PATENT DOCUMENTS

| | | |
|---|---|---|
| 4,712,068 A | 12/1987 | Savelainen |
| 5,003,265 A | 3/1991 | Leussler |
| 5,180,982 A * | 1/1993 | Zeiger .............. G01R 33/34053 324/318 |
| 6,252,403 B1 | 6/2001 | Alsop |
| 6,751,847 B1 | 6/2004 | Brey et al. |
| 6,958,608 B2 | 10/2005 | Takagi et al. |
| 8,040,136 B2 | 10/2011 | Tanaka et al. |
| 2016/0116554 A1 | 4/2016 | Sakellariou et al. |

FOREIGN PATENT DOCUMENTS

| | | |
|---|---|---|
| EP | 1571459 | 12/2008 |
| JP | 4787033 B2 | 10/2011 |
| WO | 2019226624 | 11/2019 |

OTHER PUBLICATIONS

Dillmann, A novel low-E field coil to minimize heating of biological samples in solid-state multinuclear NMR experiments, Journal of Magnetic Resonance 187 (2007) 10-18.

(Continued)

*Primary Examiner* — G. M. A Hyder
(74) *Attorney, Agent, or Firm* — Benoît & Côté, Inc.

(57) ABSTRACT

An NMR probehead having a transceiver coil arrangement comprises at least one transceiver coil for generating an HF B1 magnetic field, the transceiver coil having a connection region and at least one electrical conductor portion with a forward winding portion that leads in a prespecified winding direction from the connection region to an axial end. A backward winding portion leads in the same winding direction, from the axial end to the connection region, with windings having a pitch P with the opposite sign to windings of the forward winding portion. The forward and backward windings, with the exception of crossover regions in which the forward and backward windings cross over each other, are arranged on the same cylindrical surface about a longitudinal axis Z'. With the invention, electric fields visible for the sample are reduced, together with other types of performance losses.

11 Claims, 10 Drawing Sheets

(56) References Cited

OTHER PUBLICATIONS

Gorkov et al., Using low-E resonators to reduce RF heating in biological samples for static solid-state NMR up to 900MHz, Journal of Magnetic Resonance 185 (2007) 77-93.
Pel et al., 1H, 23Na and 35Cl Imaging in Cementitious Materials with NMR, Appl Magn Reson (2016) 47:265-276.
Krahn et al., Resonator with reduced sample heating and increased homogeneity for solid-state NMR, J. Magn. Reson. 191 (2008) 78-92.
Stringer et al., Reduction of RF-induced sample heating with a scroll coil resonator structure for solid-state NMR probes, J. Magn. Reson. 173 (2005) 40-48.
Grant et al., A Modified Alderman-Grant Coil makes possible an efficient cross-coil probe for high field solid-state NMR of lossy biological samples, Journal of Magnetic Resonance 201 (2009) 87-92.
Jeong et al., A Solenoid-Like Coil Producing Transverse RF Fields for MR Imaging, Journal of Magnetic Resonance 127, 73-79 (1997).
Sun et al., The tilted coil for NMR experiments, Journal of Magnetic Resonance, Series A 105, 145-150 (1993).
Spektrum.de, Lexikon Der Physik, NMR-Probenköpfe, URL: https://www.spektrum.de/lexikon/physik/nmr-probenkoepfe/10387.
Privalov et al., Coil Design for Large-Volume High-B1 Homogeneity for Solid-State NMR Applications, Journal of Magnetic Resonance, Series A 123, 157-160 (1996).
Doty et al., Using a cross-coil to reduce RF heating by an order of magnitude in triple-resonance multinuclear MAS at high fields, Journal of Magnetic Resonance, 182 (2006) 239-253.

* cited by examiner

NMR PROBEHEAD

BACKGROUND OF THE INVENTION

The invention relates to an NMR probehead having a transceiver coil arrangement with at least one transceiver coil for generating a HF B1 magnetic field.

When loss-prone (especially, electrically conductive) measurement samples are examined, the electric fields generated in the measurement sample by the coil of the NMR probehead lead to performance drops, ranging from a reduction in the signal-to-noise ratio via reduced excitation bandwidth and heating to the destruction of temperature-sensitive measurement samples.

In order to shield electric fields generated by the probehead, it is known to shield the electric fields in the sample—for example, by means of a Faraday shield (see, e.g., Pel et al., 1H, 23Na and 35Cl Imaging in Cementitious Materials with NMR, Appl Magn Reson (2016) 47:265-276 and Krahn et al., Resonator with reduced sample heating and increased homogeneity for solid-state NMR, J. Magn. Reson. 191 (2008) 78-92) or by means of coils for which only the electric field of one winding is visible in the sample (see, e.g., Stringer et al., Reduction of RF-induced sample heating with a scroll coil resonator structure for solid-state NMR probes, J. Magn. Reson. 173 (2005) 40-48 and Dillmann et al., A novel low-E field coil to minimize heating of biological samples in solid-state multinuclear NMR experiment, J. Magn. Reson. 187 (2007) 10-18).

Another common measure to reduce the electric fields in NMR probeheads is the reduction of the inductance of the coil for the highest measurement frequency, for example by a cross-coil configuration (see, e.g., Gorkov et al., Using low-E resonators to reduce RF heating in biological samples for static solid-state NMR up to 900 MHz, Journal of Magnetic Resonance 185 (2007) 77-93 and Grant et al., A Modified Alderman-Grant Coil makes possible an efficient cross-coil probe for high field solid-state NMR of lossy biological samples, Journal of Magnetic Resonance 201 (2009) 87-92), by replacing a solenoid coil with inductively coupled single-turn resonators (see, e.g., patent document U.S. Pat. No. 5,003,265) or by connecting solenoid coils in parallel (see, e.g., patent document U.S. Pat. No. 5,180,982). Furthermore, designs are known in which solenoid coils with parallel-connected windings are used (see, e.g., patent document JP4787033). However, the use of low-inductance coils and resonators generally only minimizes losses when measuring at proton frequencies. The losses in measurements on other frequencies (X nuclei) are usually not perceived as a problem.

From U.S. Pat. No. 5,180,982 and patent document EP1571459, it is known to use coils which have windings with different winding directions; from patent document U.S. Pat. No. 6,751,847, coils are known which are wound with the same winding direction but with inverted pitch.

For example, coil arrangements with a center tap are known from U.S. Pat. No. 5,180,982 and EP1571459, in which, starting from the center tap, coil parts with windings extend in opposite directions and with opposite directionality, but both with a positive slope. The two coil parts in U.S. Pat. No. 5,180,982 are wound with a non-vanishing slope, whereas in EP1571459, two windings in the form of superconducting disks are aligned perpendicular to the center axis and are connected by vias (bridge elements). The disadvantage here is that the potential difference built up over the two halves of the coil is still approximately half the potential difference of a solenoid with twice the number of windings over the full length of the coil. The reduction in electrical losses is therefore limited. Furthermore, the inductance of the transceiver coil decreases, which reduces the efficiency of multi-core circuits and leads to losses in performance.

To reduce the electrical fields, U.S. Pat. No. 6,751,847 proposes a coil which has forward windings on the outside of a dielectric, cylindrical carrier, and backward windings on the inside. Forward and backward windings are therefore situated on cylindrical surfaces with different radii. Forward and backward windings have the same winding direction but opposite slopes. For a measurement sample, such a coil acts like a coil with half the number of windings. The conductor material of the inner windings shields the potentials of the outer windings. The electrical fields generated by such a coil in a measurement sample largely correspond to those generated by the inner windings of the coil. However, dividing the windings on the inside and outside of a dielectric carrier creates capacitive coupling between the inner and outer windings. Since the windings have high potential differences, at least in the region of the leads, the construction has a strong "capacitive" effect, especially if the carrier is made of a material with a high dielectric constant, such as aluminum oxide ceramic/sapphire or zirconium oxide ceramic. The eigenfrequency is therefore greatly reduced compared to a coil that has windings on only one side of the carrier. In order to compensate for this, the number of windings and thus the inductance of the coil must be reduced, which in turn leads to performance losses when tuning several measurement frequencies on a single transceiver coil.

SUMMARY OF THE INVENTION

The invention provides an NMR probehead with a coil geometry, with which the electric fields generated in the sample during operation can be reduced, and at the same time other performance losses can be reduced. In the NMR probehead according to the invention, forward and backward windings of the electrical coil portion, except for crossover regions in which the forward and backward windings cross over each other (criss-cross geometry), are arranged on the same cylindrical surface about a longitudinal axis Z'.

Each coil portion comprises a forward winding portion and a backward winding portion which are arranged between an axial end of the transceiver coil and the connection region on the same cylindrical surface—i.e., windings with opposite directions are located on the same surface. The surface is preferably a circular cylindrical surface. In this case, the forward and backward windings are then at the same radial distance about the longitudinal axis. However, it is also conceivable for the forward and backward windings to run on the same cylindrical surface with a polygonal, for example square, cross-section. Regardless of the shape of the cross-section, an electrical conductor of the forward winding portion leads from the connection region, with a prespecified winding direction, to the axial end of the transceiver coil, and then from there, with the same winding direction, back to the connection region, wherein the windings of the backward winding portion have a pitch with the opposite sign than those of the forward winding portion, preferably with the same pitch value. The pitch of a winding is understood to be the height of a full turn of a winding, i.e., the difference in the Z' values of the center of the conductor track after a full rotation around the longitudinal axis. The connection area is used to connect the electrical coil portion to a matching network and may comprise connections for multiple electrical coil portions. A coil portion runs between two connections of the connection region, so that the applied voltage is found between the start of the forward windings and the end of the backward windings of each coil portion.

In order to arrange the forward windings and backward windings on the same cylindrical surface, the forward and backward windings must cross over each other. The crossovers occur on a portion of the circumference (crossover region) that is as little extended as possible, with the electrical conductor of the forward winding portion or the backward winding portion preferably remaining on the cylindrical surface, whereas the other electrical conductor crosses the first electrical conductor in the form of a bridge element. It is advantageous if the crossover region comprises less than 20%, better 10%, and in particular less than 5% of the conductor length of the forward or backward windings.

If several coil portions are provided, for example if the connection region is arranged between two coil portions (i.e., not at an axial end of the transceiver coil), these can be designed as separate components that are electrically connected to one another in the connection region, or as parts of a conductive structure which can also comprise the connection region.

The NMR probehead is preferably tuned to at least two frequencies.

The potentials along the conductor of the coil portions are defined by the matching network to which the electrical coil portion is connected via the connection region. In the prior art, it is customary to design the matching network in such a way that, during operation, the potential at the connection points is opposite and, as far as possible, the same in terms of value (balanced network). If such a matching network is used for the probehead according to the invention, potentials with opposite signs are present on forward windings and backward windings. The winding at the transition from the forward winding portion to the backward winding portion is referred to as the "return winding". This return winding comprises that point of the conductor at which the potential is 0 during operation. The return winding is located at an axial end of the transceiver coil and occupies a special position, since in the region of the return winding there is a change of sign in the potential and the pitch of the coil portion. Depending on the number of windings of the coil portion, the return winding may be assigned to the forward winding portion or the backward winding portion, or partially to the forward winding portion and partially to the backward winding portion.

In a preferred embodiment in which the coil portion comprises a backward winding having a zero potential point, the forward windings and backward windings of a coil portion, except for the return winding, are preferably arranged alternating. In this embodiment, the windings of the forward winding portion and the backward winding portion of a coil portion 2a, 2b are nested in one another such that there is a backward winding between two forward windings, and the potentials of the adjacent windings can largely compensate for each other.

The geometry of the windings and the connection region is chosen so that the potentials during operation at comparable positions of adjacent windings (e.g., at the start of the winding or in the center or at the end) are the same or similar in value. The potential is considered to be similar if $U1/UN = (N/2-1)/(N/2)$, where U1: voltage across first winding, with U1: voltage over the first winding; UN: voltage over N windings.

Preferably, the windings of the forward winding portion and the backward winding portion are thus axially nested in one another in such a way that the maximum possible potential difference (sum of the potential differences of all adjacent pairs of windings) results between adjacent windings during operation. For this purpose, in particular the first winding of the forward winding portion is arranged adjacent to the last winding of the backward winding portion (i.e., the first and the last winding of the electrical coil portion). In this way, windings of opposite potential are placed adjacent to one another.

In a special embodiment of the probehead according to the invention, the connection region is arranged at a first axial end of the transceiver coil, wherein the forward winding portion leads, starting from the connection region to a second axial end of the transceiver coil, and wherein the backward winding portion leads, starting from the second axial end of the transceiver coil, to the connection region. In principle, the electrical coil portion forms two series-connected, axially nested, solenoid-like portions with the same winding sense, the forward and backward windings having pitches of opposite signs. The electrical coil portion thus comprises, in particular, exclusively windings which run around the longitudinal axis Z' of the transceiver coil.

An alternative embodiment provides that the transceiver coil comprises at least two electrical coil portions and that the connection region is arranged between the two coil portions, preferably in the center. In this case, the forward windings of the first electrical coil portion lead, starting from the connection region, to the first axial end of the transceiver coil, and the backward windings of the first electrical coil portion lead, starting from the first axial end of the transceiver coil, to the connection region, and the forward windings of the second electrical coil portion lead, starting from the connection region, to the second axial end of the transceiver coil, and the backward windings of the second electrical coil portion lead, starting from the second axial end of the transceiver coil, to the connection region.

This embodiment thus comprises two coil portions, each of which has forward windings and backward windings, the forward windings and backward windings of each coil portion being arranged on the same cylindrical surface. Preferably, all windings of the two coil portions are arranged on the same cylindrical surface (with the exception of the crossover regions). Each coil portion forms two serially connected solenoid coils that are axially nested in one another, the coil portions being connected in parallel. The connection region is located between the first axial end and the second axial end of the transceiver coil. The coil portions extend in opposite axial directions but have the same winding sense.

Preferably, in the connection region (even if the forward and backward windings are arranged alternating within a coil portion), the first forward winding (or backward winding) of the first coil portion (connection winding of the first coil portion) is arranged adjacent to the first forward winding (or backward winding) of the second coil portion (connection winding of the second coil portion). This simplifies the design and the technical implementation of the connection region. In particular, the two coil portions can be arranged mirror-symmetrically to one another with respect to the connection region.

Alternatively, an alternating arrangement of forward and backward windings (that is to say, including the connection windings) can also be provided over both coil portions. This can contribute to a further reduction in the electrical field in the measurement sample.

The centerline of a coil portion is generally defined as $$\begin{pmatrix} R(t)*\sin(2\pi t) \\ R(t)*\cos(2\pi t) \\ P(t)*t + T(t)*\cos(2\pi t + \varphi) \end{pmatrix} \text{ with } t \in \{0 \ldots N\}, \text{ where}$$

P: The pitch of the windings (distance covered by one turn in the Z' direction),
T: The tilt of the windings (amplitude of a sinusoidal modulation of the Z'-position of the conductor center plane over one turn),
φ: The orientation/direction of tilt of the windings,
R: The radius of the transceiver coil,
N: The sum of the number of windings of the forward winding portion NH and the backward winding portion NR: N=NH+NR, and
where t is a running parameter running between 0 and the number of windings N,
wherein $t \in \mathbb{R}$ and $0 \le t \le N$.

For S(t)=const and T(t)=0, a normal solenoid results, with no backward winding portion.

For a coil according to the invention, the following applies for each coil portion:

$$\text{sgn}(\int_0^{NH} S(t)dt) = -\text{sgn}(\int_0^{NH} S(t)dt),$$

where "sgn" is the sign function.

In a simple embodiment of the transceiver coil according to the invention, both the forward winding portion and the backward winding portion have a constant pitch P, the pitch P of the forward and backward winding portions being preferably equal in value but opposite, and the number of windings NH of the forward winding portion being equal to the number of windings NR of the backward winding portion. This means that: for the case of a constant pitch P, and where the forward winding portion and the backward winding portion have the same number of windings NH=NR=N/2: P(t)=P for t=0 ... NH (for the forward winding portion) and P(t)=−P for t=NH ... N (for the backward winding portion). Particularly preferably, the transceiver coil has a solenoid-like forward winding portion and a solenoid-like backward winding portion with no tilt (that is, T(t)=0). Such a coil can easily be made from a wire or strip conductor which is wound around a carrier, for example.

A strip-shaped conductor has a smaller thickness (in particular at least one order of magnitude smaller) in relation to the conductor path width and has a substantially rectangular cross-section. The strip-shaped conductor preferably comprises a substrate with a thin metallization, in particular an HTS coating.

Preferably, the conductor path thickness W of the electrical conductor is at most 500 μm and/or is at least as great as twice the penetration depth of the HF magnetic field B1 into the electrical conductor.

In a particularly preferred embodiment, the forward and backward windings are arranged on a circular cylindrical surface (i.e., R(t)=const.). This is particularly easy to manufacture, since a circular-cylindrical carrier can be used.

The electrical coil portions are particularly preferably designed as strip-shaped coil portions with a conductor path width W. The conductor path width is the width of the conductor perpendicular to the center of the conductor. A strip-shaped coil portion has a conductor path width which is greater than the thickness of the coil portion. The strip width can be constant over the entire conductor (W=const.) or can vary (W=W(t)). In the case of a conductor path width W(t) that varies over the course t of the length of the electrical conductor, the conductor path width can also vary within one turn. Strip-shaped coil portions can be produced, for example, from a tubular blank by etching out, milling out, or cutting out regions that are not required. Furthermore, cylindrical conductors can be wound around a carrier and pressed flat on it, or strip-shaped conductors are wound on a carrier and pressed onto the surface. Without pressing, the torsion during winding means that the conductors do not lie flat on the carrier. Round conductors can also be wound on a carrier and then formed into strip conductors by pressing.

In a specific embodiment, within the forward winding portion and/or the backward winding portion, the conductor path width of the electrical conductor and/or the gap width D between adjacent windings of the forward winding portion and/or the backward winding portion varies along the length t of the electrical conductor (W=W(t), where t=0 ... N).

In particular, the conductor path width W of the electrical coil portion and/or the gap width D between adjacent windings of the transceiver coil can vary within each winding. Preferably, the conductor path width within each winding varies between a minimum value and a maximum value, such that the conductor path width within each turn decreases and increases at least twice, preferably periodically. Each winding of the coil portion thus comprises two regions with a minimum conductor path width and two regions with a maximum conductor path width. Such an embodiment allows a higher efficiency of a transceiver coil for T(t)≠0 than a coil with a constant conductor path width. Furthermore, this allows a higher transparency for magnetic fields of a second coil in a cross-coil arrangement, without having an excessively negative effect on the quality factor. If the regions of the electrical coil portion with the minimum value for the conductor path width are arranged offset by 180° with respect to a rotation about the longitudinal axis, regions with the minimum width lie on opposing cylindric surface segments of the cylindrical surface, which means that open spaces with a maximum gap width lie on opposing cylindrical surface segments. This creates a greater number of transparent regions that can be used to superimpose a second HF magnetic field, which is generated by a second coil of the MR probehead, on the first HF magnetic field. The sample volume is then "visible" for both HF magnetic fields. At the same time, the transceiver coil can have a conductor path width in the remaining regions which optimizes the quality factor of the coil. In this way, the probehead can be efficiently tuned to a plurality of frequencies.

In a further special embodiment, the slope S, in particular the pitch P, of the windings varies along the length t of the electrical coil portion.

A change in the slope S=S(t) can be realized by changing the pitch P (slope of a winding), and also by changing the local slope S within a winding while keeping P constant.

The slope S is therefore dependent on the position along the conductor (S=S(t)). The pitch P is defined as the integral of the slope over one turn, $P = \int_{tn}^{tn+1} S(t)dt$, i.e., the distance in the direction of the longitudinal axis covered by the electrical conductor during a full revolution, such that P=z'(tn)−z'(tn+1). In this case, t0 is the beginning of the nth winding. Since t is a unitless running parameter, the pitch P is equal to the slope S for a constant slope S, i.e., if S(t)=S for the range t=t0 ... t0+1.

The multiple windings can also be designed as individual windings that are inductively or capacitively coupled. The pitch P then describes the distance between two adjacent individual windings. A variable slope S can improve the homogeneity along the z-axis (on-axis). Even in the case of a coil with a constant pitch P, the local slope S can vary within a winding, and even reverse sign. The pitch P of a winding is said to be positive if the Z' coordinate of the center lines for t0+1 is greater than the Z' coordinate at t0. This is true even if the Z' coordinate assumes smaller less than at t0 in the interval between t0 and t0+1.

For finite solenoid coils, the amplitude of the B1 magnetic field drops off at the axial ends. By reducing the pitch P at the axial ends, the windings can be made closer together. In this way, the lack of current density due to the finiteness of the coil can be compensated for. An improvement in the homogeneity along the longitudinal axis Z' for short transceiver coils that are operated far from the eigenfrequencies therefore results in particular if the pitch P at the axial ends of the transceiver coil is less than in the axial center.

If a "short" transceiver coil with a center tap is operated at/near the eigenfrequency, it is advantageous to reduce the pitch P in the center, since the approximately sinusoidal current distribution along the length of the coil portion reduces the generated field in the center, which can be compensated for by "compacting" the windings within the coil portions. The highest current density occurs in such coils in the return winding(s), which usually largely compensates for the lack of current density in a short solenoid coil.

To improve the homogeneity in the radial direction (off-axis), a further embodiment of the MR probehead according to the invention provides that the windings of the transceiver coil along the conductor have a variable tilt relative to the longitudinal axis Z', such that T=T(t).

The tilt T is defined as the amplitude of a sinusoidal modulation of the Z' position of the conductor center plane over one turn. In principle, a coil with a tilt T≠0 can also be described by a variable slope S'(t)=S(t)+T (t) cos(2π t+φ) general slope. If S'(t) is written as a Fourier series, then T describes the (k=1)-periodic part of the slope S. For each winding, the slope S can be written as:

$$S'(t)=S_0+\Sigma_{k=1}^{\infty}(S_{k,a}\cos(k2\pi t)+S_{k,b}\sin(k2\pi t)) \text{ wherein}$$

$$S(t)=S'(t)-(S_{1,a}\cos(2\pi t)+S_{1,b}\sin(2\pi t)).$$

$(S_{1,a} \cos(2\pi t)+S_{1,b} \sin(2\pi t))$ can be written as T(t) cos(2π t+φ) where T is the tilt and φ is the direction of the tilt (typically, φ=0 or φ=90°).

The tilt T can vary over the course t of the length of the electrical conductor (T=T(t)). In this case, the tilt is sectionally constant, in particular for at least one half turn (half-turn). The tilt then changes from half-turn to half-turn, which means that each half-turn is tilted at a tilt T relative to the longitudinal axis Z', wherein T≠0 for at least some of the half-turns (half-turn). The tilt T of the windings affects the B1 amplitude and the radial homogeneity. In the case of a coil with a tilt T≠0, the slope S in the first half of the turn differs from that in the second half of the turn. Usually the tilt direction is φ=0 (tilt about the Y' axis) or π/2 (tilt about the X' axis) and the radius R(t)=R.

For coils where the slope S is an arbitrary function S(t), the definition of the tilt makes only limited sense, since the effect of T(t) can also be expressed in terms of S(t). T(t) reflects a periodically varying portion of the variable slope S, which corresponds to a tilting of the (elliptical) coils with respect to the Z' axis.

If the longitudinal axis of the transceiver coil is not arranged collinear with the static magnetic field B0 used for the NMR measurement, such as in MAS measurements (magic angle spinning), the amplitude of the HF magnetic field B1 generated by the transceiver coil, and thus the efficiency of the transceiver coil, can be increased, especially if it is designed as a solenoid coil or comprises solenoid-like sections. In MAS NMR measurements, a test sample is rotated about the longitudinal axis Z', which is preferably inclined by the magic angle θ (θ=54.74°) relative to a Z-axis, which is defined by the static magnetic field B0 and in which the longitudinal extension of the NMR probehead runs during operation (i.e., when the NMR probehead is mounted in the NMR apparatus). Due to the tilt of the windings of the transceiver coil, field components of the HF magnetic field B1 parallel to the static magnetic field B0 can be minimized, or the field components of the HF magnetic field B1 orthogonal to the static magnetic field B0 can be maximized. However, by tilting the windings, in contrast to conventional (non-tilted) solenoid coils, the HF magnetic field B1 in the measurement volume is no longer parallel to Z', so that the conductors of the coil "get in the way of the field they generate". A reduction of the conductor path width of the tilted solenoid coil in these regions increases the transmission efficiency and the possible signal-to-noise ratio of a tilted solenoid coil according to the invention.

A particularly preferred embodiment provides that at least two of the quantities tilt T, slope S, and conductor path width W change over the course t of the length of the electrical conductor of the transceiver coil, in particular the slope S and one of the quantities tilt T and conductor path width W. In this way, a transceiver coil optimized for the signal-to-noise ratio (SNR) can be realized.

A further embodiment provides that at least one winding has a slope S=0 almost over the full revolution, in particular outside the crossover region (a so-called "zero-pitch" coil). Such a winding then forms a non-closed ring, i.e., S(t)=0 applies for t=t0 . . . t0+1−ε or t=t0+ε/2 . . . t0+1−ε/2, where ε>0, and ε>0 prevents a short circuit; t=t0 is the beginning of the winding. If the transceiver coil is not tilted (that is, when T=0), the windings are aligned perpendicular to the longitudinal axis over the entire range in which they have a slope S=0. Such a transceiver coil can be designed as a combination of non-closed "rings" without a pitch and portions of the electrical coil portion with a slope S>0. As a result, the ratio of conductor path width to gap width can be kept constant across the transceiver coil. As a result, the quality factor of the transceiver coil can be maximized and/or the electrical fields can be minimized in a particularly simple manner.

Further advantages of the invention are found in the description and the drawing. Likewise, the features mentioned above and those detailed below can be used according to the invention individually or collectively in any combination. The embodiments shown and described are not to be understood as an exhaustive list, but rather have an exemplary character for the description of the invention.

BRIEF DESCRIPTION OF THE DRAWINGS

FIG. 1b shows a developed view of the transceiver coil from FIG. 1a.

FIG. 2b shows a developed view of the transceiver coil from FIG. 2a.

DETAILED DESCRIPTION

Figure 1A:
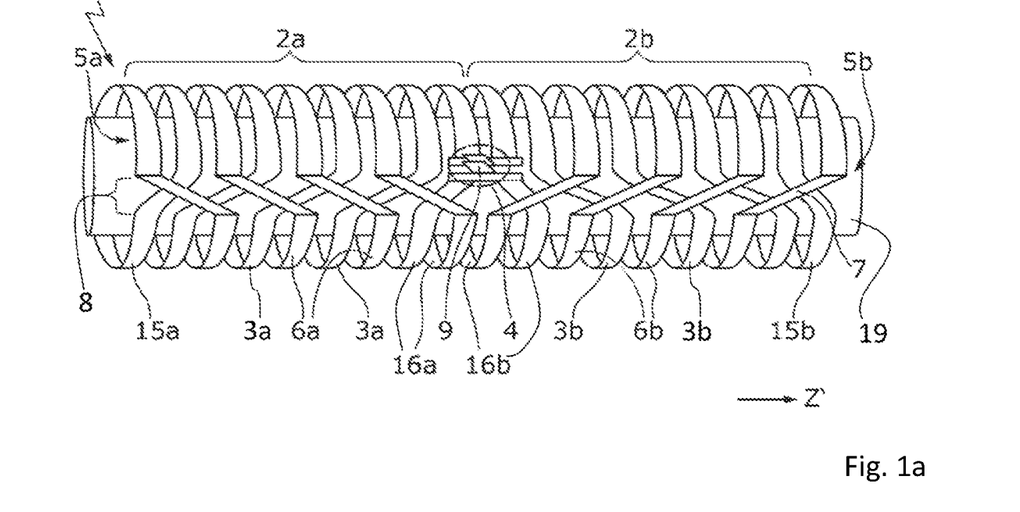
FIG. 1a shows a perspective view of an embodiment of a transceiver coil for a probehead according to the invention, in which the connection region is arranged centrally between the two axial ends of the transceiver coil.
Figure 1B:
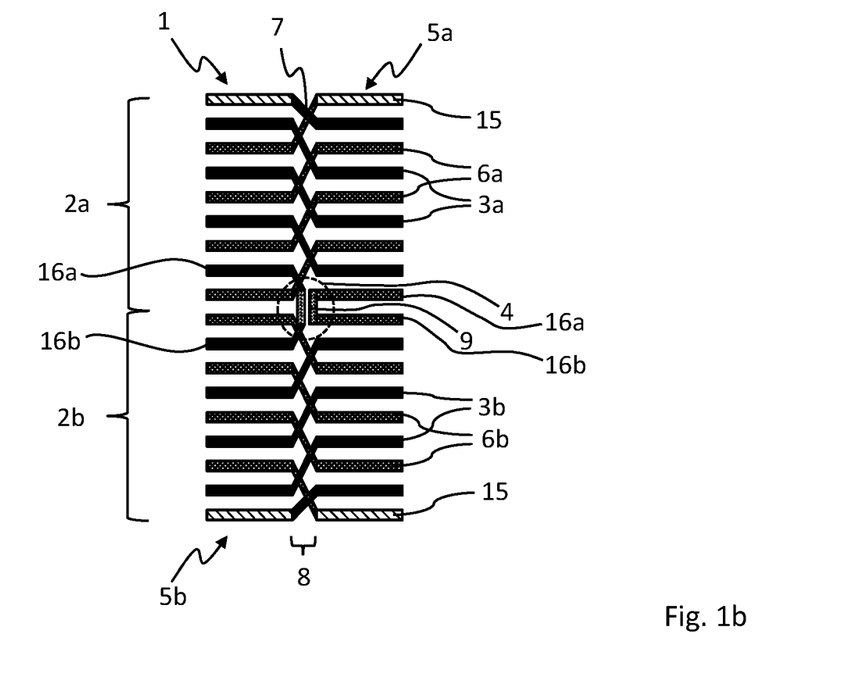

FIG. 1a, 1b show an exemplary embodiment of a transceiver coil 1 for an NMR probehead 18 according to the invention (see FIG. 10) in a perspective view and in a developed view. A measurement sample 19 to be examined is arranged in the transceiver coil 1. The transceiver coil 1 has two coil portions 2a, 2b with forward windings 3a, 3b, which run from a connection region 4 to respective axial ends 5a, 5b of the transceiver coil 1, and return, or backward, windings 6a, 6b, which run from the respective axial ends 5a, 5b back to the connection region 4. The windings that end/begin at the connection region 4 are referred to as connection windings 16a, 16b. The forward windings 3a of the first coil portion 2a and the forward windings 3b of the second coil portion 2b have the same winding sense. The backward windings 6a, 6b have opposite pitches P with respect to the forward windings 3a, 3b, but each have the same winding sense. The forward windings 3a, 3b and the return windings 6a, 6b are connected via a reverse winding 15a, 15b, which is arranged at the end 5a, 5b of the respective coil portion 2a, 2b opposite the connection region 9, and causes a reversal of the sign of the pitch P of the windings. The returning conductor (backward windings) runs on the same surface (in this case, a circular cylindrical surface) as the outgoing conductors (forward windings). The backward windings 6a, 6b are arranged in the spaces between two forward windings 3a, 3b. The crossings 7 required for this are carried out on a portion of the circumference that is as little extended as possible (crossing area 8). The crossovers 7 of the forward and backward windings 3a, 3b, 6a, 6b are implemented by means of bridge elements. The bridge elements are connecting elements that lead out of the shared peripheral surface and back again. The two coil portions 2a, 2b are mirror-symmetrical to each other with respect to the connection region 4, so that, although the forward and backward windings are arranged alternating within each conductor portion, in the connection region 4 the first forward winding (or backward winding) of the first coil portion 2a (connection winding 16a of the first coil portion 2a) is arranged adjacent to the first forward winding (or backward winding) of the second coil portion 2b (connection winding 16b of the second coil portion 2b).

Figure 2A:
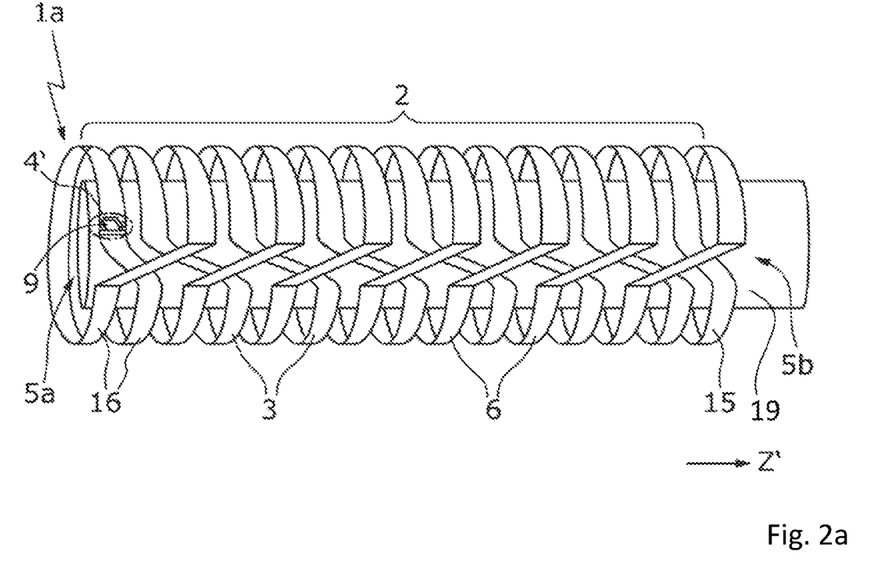
FIG. 2a shows a perspective view of a further embodiment of a transceiver coil for a probehead according to the invention in which the connection region is arranged on an axial end of the transceiver coil.
Figure 2B:
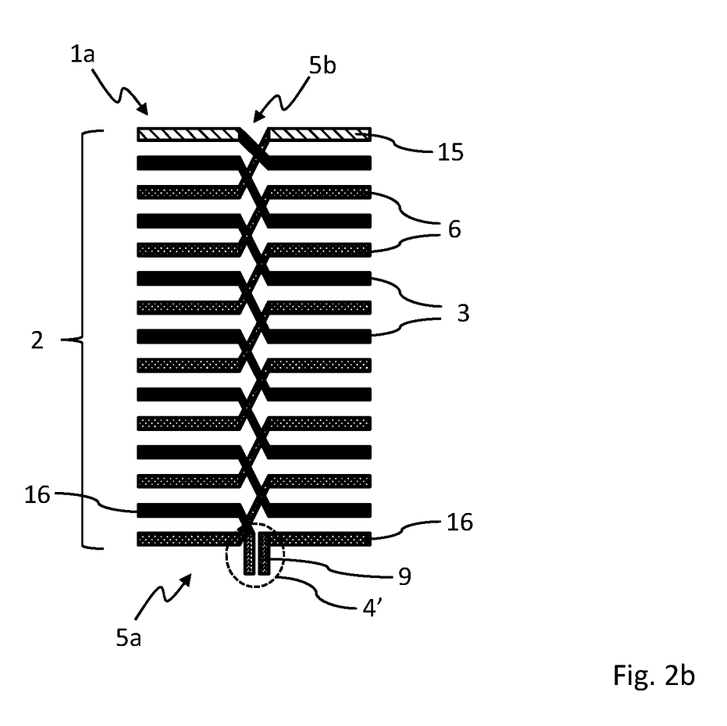

FIG. 2a, 2b show a perspective view and a developed view of an alternative embodiment of a transceiver coil 1a having only one coil portion 2 with forward windings 3 and backward windings 6. Here, the electrical conductor, starting from the axial end 5a of the transceiver coil 1a, is routed in a prespecified winding sense to the other axial end 5b of the coil, and then from there with opposite pitch P but the same winding sense back to the first axial end 5a. In this embodiment, in contrast to the embodiment shown in FIG. 1, a connection region 4' is therefore located at the first axial end 5a. As in the embodiment shown in FIG. 1, in the embodiment shown in FIG. 2, the backward windings 6 are also situated on the same surface as the forward windings 3, wherein the backward windings 6 are arranged in the spaces between two forward windings 3. The forward windings 3 and the backward windings 6 are also connected in this case via a return winding 15 which is arranged at the end 5b of the coil portion 2 opposite the connection region 4', where the sign of the pitch P of the windings reverses. The first forward turn and the last reverse turn (windings on the connection region 4') are the connection turn 16.

For all embodiments of the coil geometry according to the invention, a coil portion 2, 2a, 2b has both forward and backward windings within the meaning of the invention, with the backward windings 6a, 6b being on the same surface as the forward windings 3a, 3b and having opposite pitches P. In the special embodiments shown in the figures, a backward winding 6a, 6b is arranged in a space between two forward windings 3a, 3b within each coil portion 2a, 2b.

In the case of two coil portions 2a, 2b (FIG. 1, FIG. 5-9), the structure of the shown embodiments of the inventive transceiver coil is mirror-symmetric so that in the connection region 4, backward windings or forward windings of the two coil portions are arranged adjacent to each other.

In all embodiments, there are connections 9 in the connection region 4, 4', via which connection windings 16a, 16b of the two conductor portions 3a, 3b can be connected to a matching network 10 (see FIG. 10) in order to supply energy to the transceiver coil 1, 1a while transmitting HF pulses, or to detect the signal induced in the transceiver coil after the excitation of the measurement sample 19. The connection region can be located at one end, in one or more center regions, or at both ends, as well as combinations of center regions and ends, in particular for embodiments with several coil portions.

Figure 3:
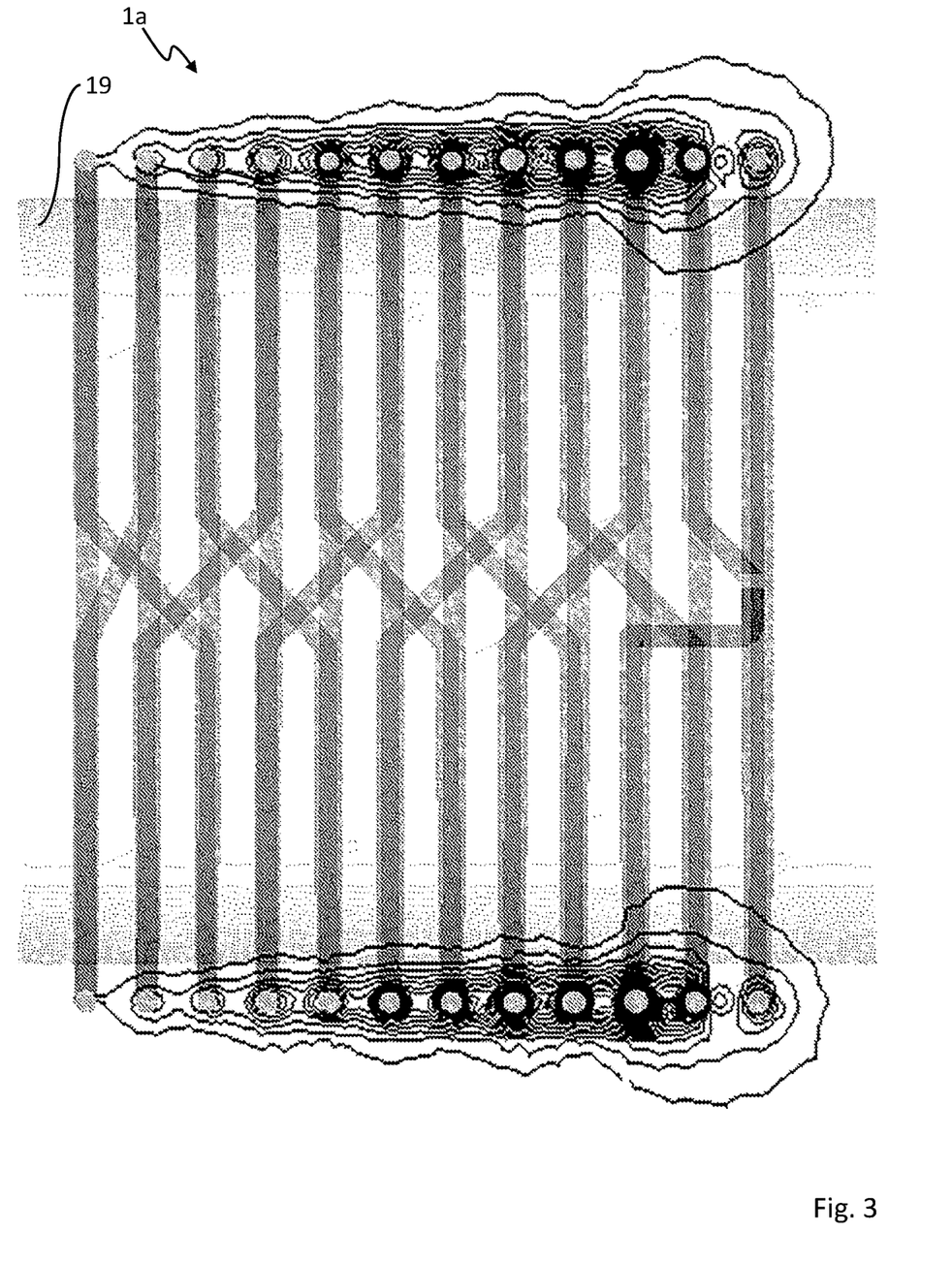
FIG. 3 shows a simulation of the profiles of the isolines of the electric field for the transceiver coil according to FIG. 2.

In the prior art, it is customary to design the matching network 10 in such a way that, during operation, an opposite potential is present at the connections 9 that is as equal as possible in terms of absolute value. As a rule, this leads to the minimum possible electric field occurring in the measurement sample with an embodiment of a transceiver coil. In the case of the transceiver coil geometries according to the invention, windings with opposite potentials are arranged at the same radial distance from the longitudinal axis of the transceiver coil, in such a way that the potentials of adjacent windings 3-6; 3a-6a; 3b-6b compensate for each other, i.e., they are as similar as possible in terms of value, but have opposite signs. A simulation of the progression of the isolines of the electrical field around the electrical conductors of a transceiver coil 1a, analogous to the coil from FIG. 2, is shown in FIG. 3. Due to the fact that the windings with the greatest potential differences are arranged next to one another, the electric field concentrates in the gaps and decays very quickly with increasing distance from the transceiver coil 1a. Therefore, the electric fields run only a little into the interior of the transceiver coil 1a, where the field of view is located in which the measurement sample 19 is arranged. If an NMR measuring head is loaded with a conductive test sample or a test sample with high dielectric losses, electric fields during the transmission of HF pulses lead to dissipation in the test sample, which can heat up the test sample. For the reception, noise caused by electric fields is picked up from the measurement sample. This is particularly disadvantageous if the transceiver coil is cryogenically cooled and has a significantly lower temperature than the measurement sample. Minimal electrical fields in the measurement sample 19, as are made possible with the geometries according to the invention, guarantee a good signal-to-noise ratio for cryogenically cooled NMR probeheads, even when operating with lossy measurement samples 19.

Figure 4A:
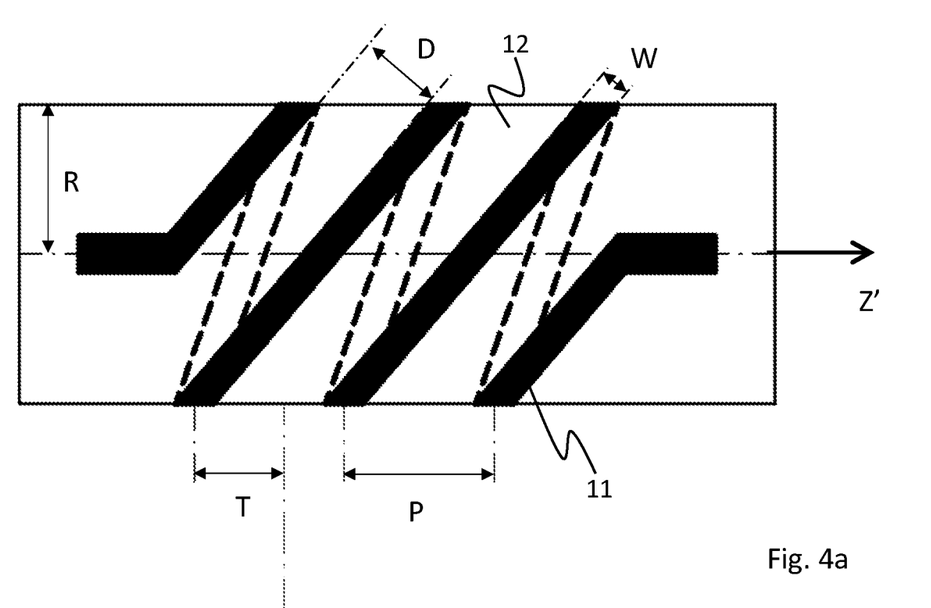
FIG. 4a shows a detail of a solenoid-like coil portion to illustrate the coil parameters when T≠0.
Figure 4B:
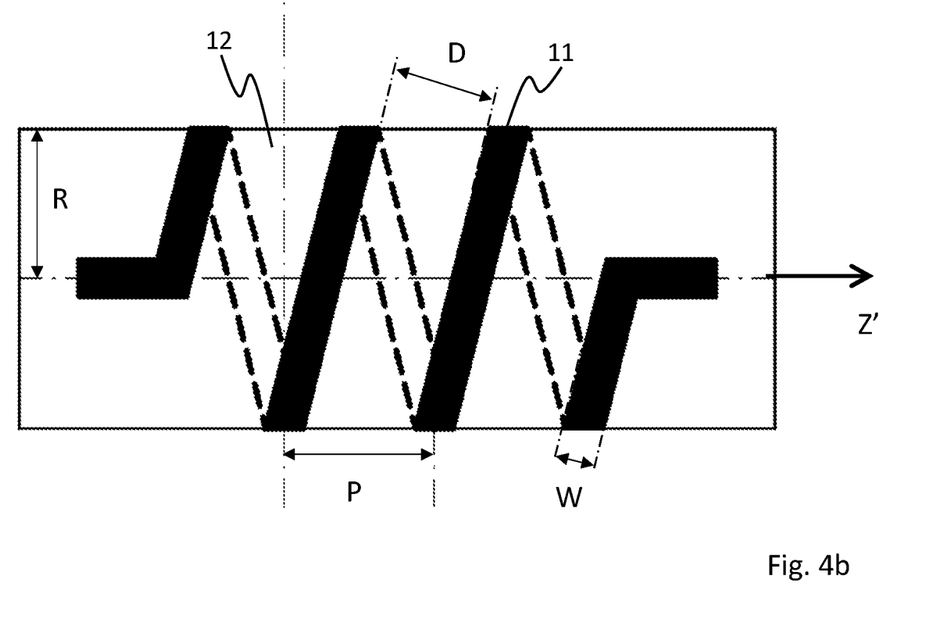
FIG. 4b shows a detail of a solenoid-like coil portion to illustrate the coil parameters when T=0.

A further optimization of the NMR probehead according to the invention can be carried out by varying the coil parameters of the transceiver coil:

FIG. 4a and FIG. 4b each schematically show a detail of a solenoid-like coil with a strip-shaped conductor (conductor path 11) with which the coil parameters are initially illustrated. The solenoid-like coil in FIG. 4a and FIG. 4b is arranged along the longitudinal axis Z' (coil axis), the longitudinal axis Z' being perpendicular to an X'-Y' plane. The solenoid-shaped coil is parameterized by a track width W of the track 11, a gap width D of a space 12, a pitch P of the windings, a pitch T of the windings, and a radius R of the windings. In the embodiment shown here, a total of three windings are shown.

The conductor path width W indicates the width of the conductor path 11. The conductor path width W is determined by the outermost points of the conductor path 11. In the embodiment shown here, the conductor path width W is kept constant over the entire length of the conductor (i.e., W(t)=const.).

The gap width D indicates the width of the intermediate space 12 between the windings of the conductor path 11. The gap width D is determined over the outermost points of the region between the adjacent windings of the conductor path 11.

The pitch of the windings $P=\int_{tn}^{tn+1} S(t)dt=S$ for the case of constant slope over the length of a winding, $S(t)=S$ from to to tn+1, indicates the distance in the Z' direction between two adjacent windings (i.e., the advancement of the coil after a complete turn), and is determined via the central line of the conductor path 11. A constant pitch P does not rule out that the slope S varies within a winding, i.e., the pitch P can also be constant in the case of a non-constant S(t), the pitch P per winding being constant in sections.

The tilt T of the windings indicates the tilt of the windings with respect to the longitudinal axis Z' and corresponds to the amplitude of a sinusoidal modulation of the Z' position of the conductor center plane over one turn. With a constant pitch P and tilt T over several windings, a simple determination Max(Z(t)−Z(t+1))−S)/2 is possible, where t varies in the interval t0 . . . t0+1.

The radius R of the windings indicates the radius on which the conductor path 11 lies in the case of circular-cylindrical coils. In general, R=R(t), so that non-circular-cylindrical coils can also be described by an R.

The solenoid coils shown in FIG. 4a and FIG. 4b each have a constant conductor path width W, a constant gap width D and a constant slope S (and thus also a constant pitch P), wherein the coil shown in FIG. 4a is a tilted coil pitch (T≠0), and the coil shown in FIG. 4a is a non-tilted coil (T=0).

The embodiments of the inventive transceiver coil 1, 1a shown in FIG. 1 and FIG. 2 each have a constant conductor path width W, a constant pitch P and a tilt T=0.

Special variants of the transceiver coil geometry according to the invention are described below, with which the performance of the NMR coil head according to the invention can be further improved by varying the coil parameters.

Figure 5:
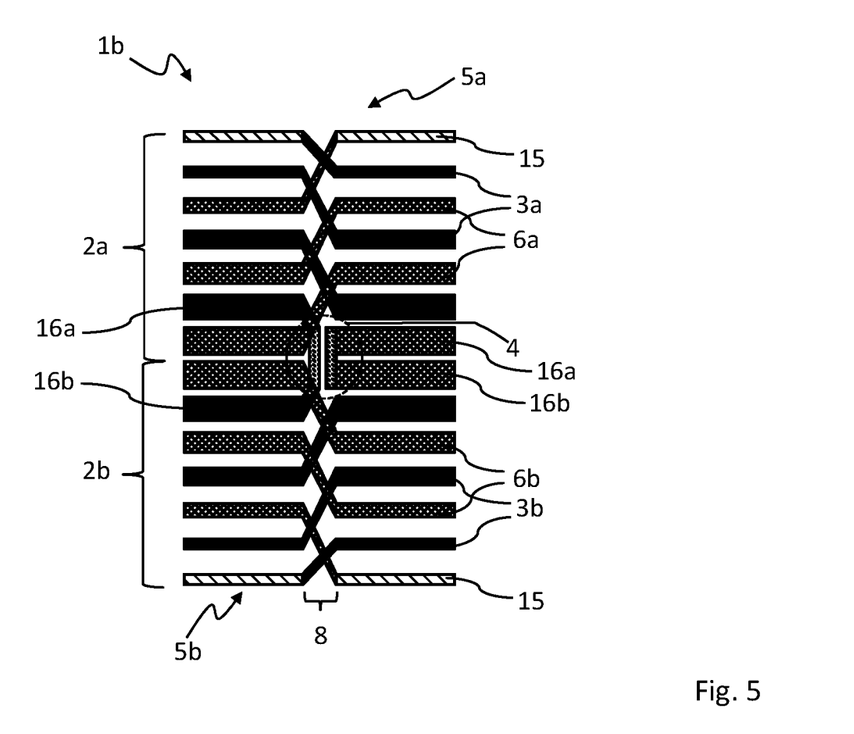
FIG. 5 shows a developed view of an embodiment of a transceiver coil for a probehead according to the invention, in which the conductor path width and the gap width between adjacent windings of the transceiver coil vary along the length of the electrical coil portion.

FIG. 5 shows an alternative embodiment of the transceiver coil 1b in which the conductor path width W and the gap width D along the conductor path is variable (W=W(t)), the conductor path width within each turn (except for the crossover region 8) being constant (W=const.) but changing from turn to turn. In the central connection region 4 (where there is a large potential difference), the conductor path widths W are maximum and the gap widths D are minimum. In the direction of the axial ends 5a, 5b (where the potential difference becomes smaller), the conductor path widths W decrease and the gap widths D increase accordingly. At the axial ends 5a, 5b (at which there is a minimal potential difference), the conductor path widths W are minimal and the gap widths D are maximal. In this embodiment, the conductor path width W and the gap width D are therefore a function of the potential difference.

As in the embodiment shown in FIG. 1, the embodiment shown in FIG. 5 comprises two coil portions 2a, 2b with the forward windings 3a, 3b and backward windings 6a, 6b, wherein the electrical conductor leads, starting from the central connection region 4, to the respective axial ends 5a, 5b of the transceiver coil 1, at a predetermined pitch P, and then from there is routed back with opposite pitch P to the central connection region 4. However, a variable conductor path width W and/or gap width D can also be implemented in embodiments with only one coil portion. In this case, the gap width D increases and the conductor path width W decreases from the first axial end 5a to the second axial end 5b.

With the transceiver coil 1b shown in FIG. 5, it is possible on the one hand to minimize the electric fields in the measurement volume and on the other hand to improve the quality factor of the transceiver coil 1b, especially when the ratio of the conductor path width and gap width W/D in the regions of low potential differences is chosen so that the electrical losses in the transceiver coil are minimized. In the region of higher potentials, additional electrical losses in the transceiver coil are accepted in order to reduce the losses induced by the electrical fields in a measurement sample (not shown in FIG. 5). If the gap width D becomes too small in the region of high potential differences, the risk of voltage breakdowns during operation increases. As such, there is a lower limit for the gap width D, which is determined by the dielectric strength. It is particularly advantageous if D>0.01 mm, but in particular D>0.1 mm. This enables greatly reduced electrical fields in the test sample with reproducible manufacturability and sufficient dielectric strength for typical test sample diameters in the range of mm to 5 mm.

Like the embodiment shown in FIG. 1, the embodiment shown in FIG. 5 also has non-tilted windings (T(t)=0). The pitch P of the windings has a constant value (|P|=const.). The exception to this is the return winding 15a, 15b and one of the connection windings, which have half the value of the pitch P due to the given boundary conditions (reversal of the pitch P, position of the connection region). Nonetheless, such a coil can be considered a coil with constant pitch P. The slope S within each winding is S(t)=0 for all regions except for the crossover regions 8. The above-mentioned constant pitch of the windings |P|=const. is thus realized by the crossover regions 8.

Solenoid coils designed in this way are known by the term "zero-pitch" coils. By analogy, a coil according to the invention with S(t)=0 for all t outside the crossover range should also be referred to as a zero-pitch coil.

In general, a variable conductor path width W and/or gap width D with any given slopes S and/or tilts T can be used, as long as adjacent conductor paths do not touch.

Figure 6:
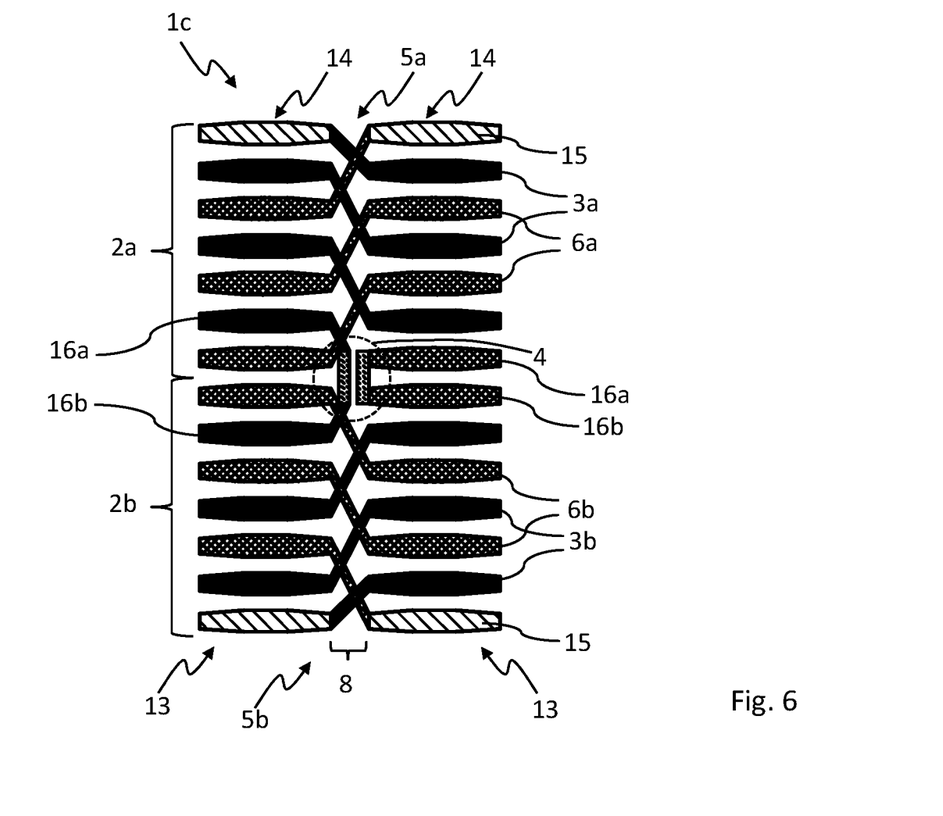
FIG. 6 shows a developed view of an embodiment of a transceiver coil for a probehead according to the invention, in which the conductor path width and the gap width vary within each winding of the conductor.

FIG. 6 shows a further alternative embodiment of the transceiver coil 1c in which the conductor path width W and the gap width D vary within each winding along the extension of the conductor (W=W(t)). Preferably, as shown in FIG. 6, in the crossover region 8 and a region 13 radially opposite the center of the crossover region 8 (when the transceiver coil 1c is wound), the conductor path widths W are minimal and the gap widths D maximal. In two other regions 14 of each turn, between the crossing area 8 and the radially opposite area 13, the conductor track widths W are at a maximum and the gap widths D are at a minimum. In the embodiment shown in FIG. 6, the minimum values and/or maximum values are offset by 180° with respect to a rotation about the longitudinal axis. There are therefore two regions (crossover region 8 and radially opposite region 13) with minimum conductor path widths W and two regions (further regions 14) with maximum conductor path widths W. The conductor path widths W are preferably varied periodically there.

As in the embodiment shown in FIG. 1, the embodiment shown in FIG. 6 has two coil portions 2a, 2b with the forward windings 3a, 3b and backward windings 6a, 6b, wherein the electrical conductor leads, starting from a central connection region 4, to the axial ends 5a, 5b of the transceiver coil 1, with a prespecified pitch P, and then from there is routed back, with the opposite pitch P, to the central connection region 4. However, a variation of the conductor path width W and/or gap width D can also be implemented in embodiments with only one coil portion.

With the transceiver coil 1c shown in FIG. 6, it is possible, by increasing the gap width D, to obtain spaces ("windows") which offer increased transparency for other magnetic fields to be radiated. As a result, a second HF magnetic field, which is generated for example by a second transceiver coil (not shown) of the transceiver coil arrangement of the MR probehead according to the invention, can be superimposed with the first HF magnetic field of the transceiver coil 1. By providing a second transceiver coil, other NMR-active nuclei can be examined, in addition to protons.

Like the embodiment shown in FIG. 5, the embodiment shown in FIG. 6 is a zero-pitch coil, wherein the windings are not tilted (T(t)=0) and have a pitch P with a constant value (|P|=const.).

However, a variable conductor path width W and/or gap width D can be used with any slopes S and/or tilts T. Furthermore, the conductor path width W and/or gap width D can also be varied in such a way that the conductor path width is not minimal in the crossover region 8.

Figure 7:
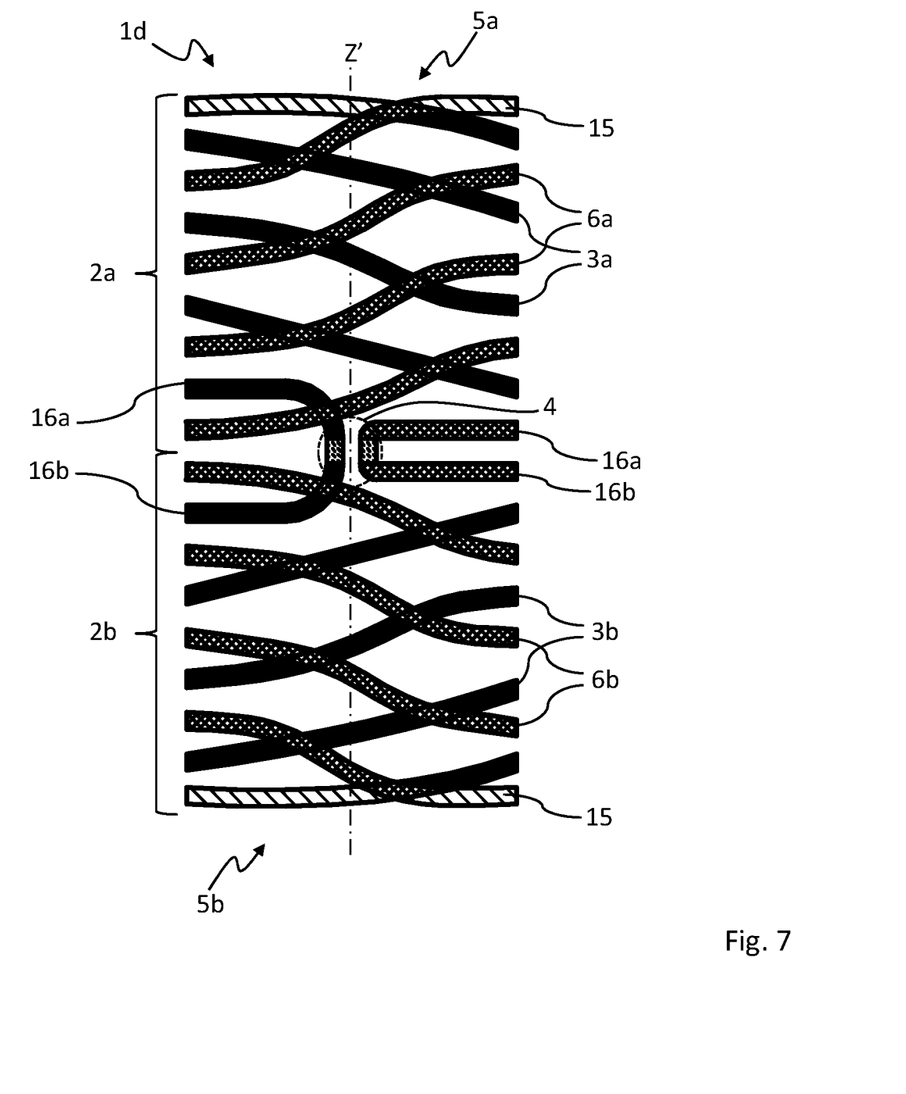
FIG. 7 shows a developed view of an embodiment of a transceiver coil for a probehead according to the invention, with a variable slope S within each turn and a constant pitch P.

FIG. 7 shows a further alternative embodiment of the transceiver coil 1d with a substantially constant pitch P (i.e., with the exception of the backward windings at the ends of the conductor positions, i.e., at the axial ends 5a, 5b and optionally at the connection windings in the central connection region 4), wherein the slope S varies within each turn. This means that P(t) is constant in portions, and P(t)=P1, P2, . . . for the first, second, etc. winding. As in the previously described embodiments, the windings of the embodiment shown in FIG. 7 have no tilt (T=0).

As in the embodiment shown in FIG. 1, the embodiment shown in FIG. 7 has two coil portions 2a, 2b with the forward windings 3a, 3b and backward windings 6a, 6b, wherein the electrical conductor leads, starting from a central connection region 4, to the axial ends 5a, 5b of the transceiver coil 1, with a prespecified winding direction and with a prespecified pitch P, and then from there is routed back, with the opposite pitch P but with the same winding direction, to the central connection region 4. The winding direction of the electrical conductors differs between the two coil portions—that is, for example, it is positive for the forward winding portion 2a and negative for the backward winding portion 2b. However, a constant pitch P with a variable slope S within the windings can also be implemented in embodiments with only one coil portion.

Figure 8:
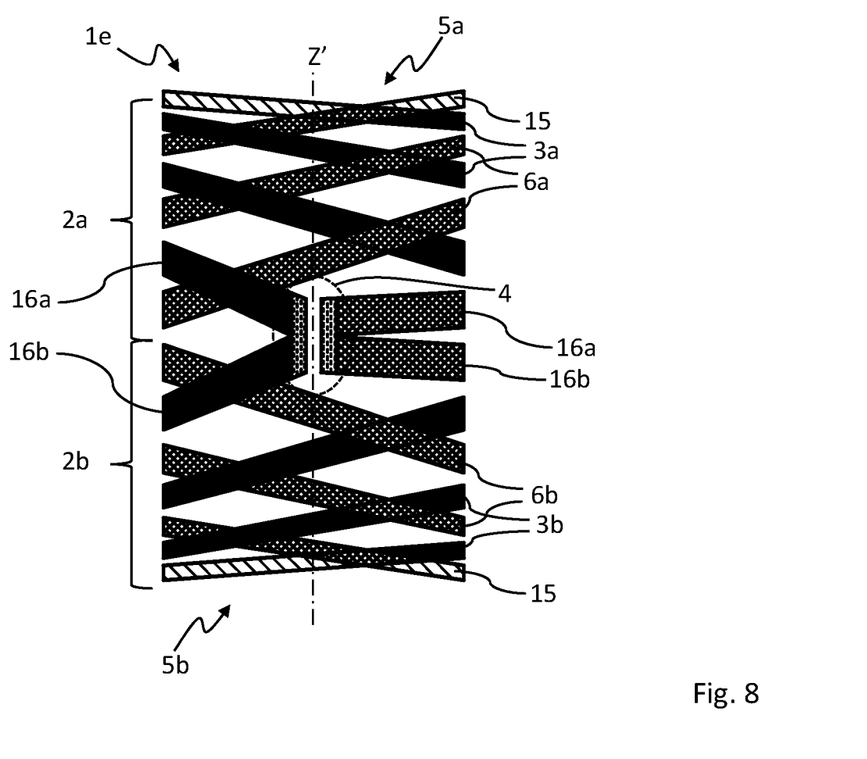
FIG. 8 shows a developed view of an embodiment of a transceiver coil for a probehead according to the invention in which the windings of the transceiver coil have a variable pitch P along the coil portion and a variable conductor path width along the entire length of the electrical coil portion.

FIG. 8 shows a further alternative embodiment of the transceiver coil 1e in which the pitch P, the conductor path width W, and the gap width D of the windings is variable along the entire extent t of the conductor, and the tilt T of the windings is zero (P=P(t) and T=0). In the embodiment shown in FIG. 8, the pitch P, the conductor path width W and the gap width D are at a maximum in the central connection region 4 and decrease in the direction of the axial ends 5a, 5b. At the axial ends 5a, 5b, the pitch P, the conductor path width W and the gap width D are minimal (optionally with the exception of one of the connection windings).

As in the embodiment shown in FIG. 1, the embodiment shown in FIG. 8 has two coil portions 2a, 2b with the forward windings 3a, 3b and backward windings 6a, 6b, wherein the electrical conductor leads, starting from a central connection region 4, to the axial ends 5a, 5b of the transceiver coil 1, always with a prespecified winding direction and a prespecified pitch P, and then from there is routed back, with the opposite pitch P but with the same winding direction, to the central connection region 4. A variable pitch P can, however, also be implemented in embodiments with only one coil portion. In the case of operation close to the eigenfrequency, the pitch P would in this case decrease from the first axial end to the second axial end. In the case of operation well below the eigenfrequency, the pitch P would decrease from the first axial end towards the center of the coil and then increase again towards the second axial end.

With this transceiver coil 1e, it is possible to improve the homogeneity in the axial direction, i.e., to compensate for the finite coil length.

Figure 9:
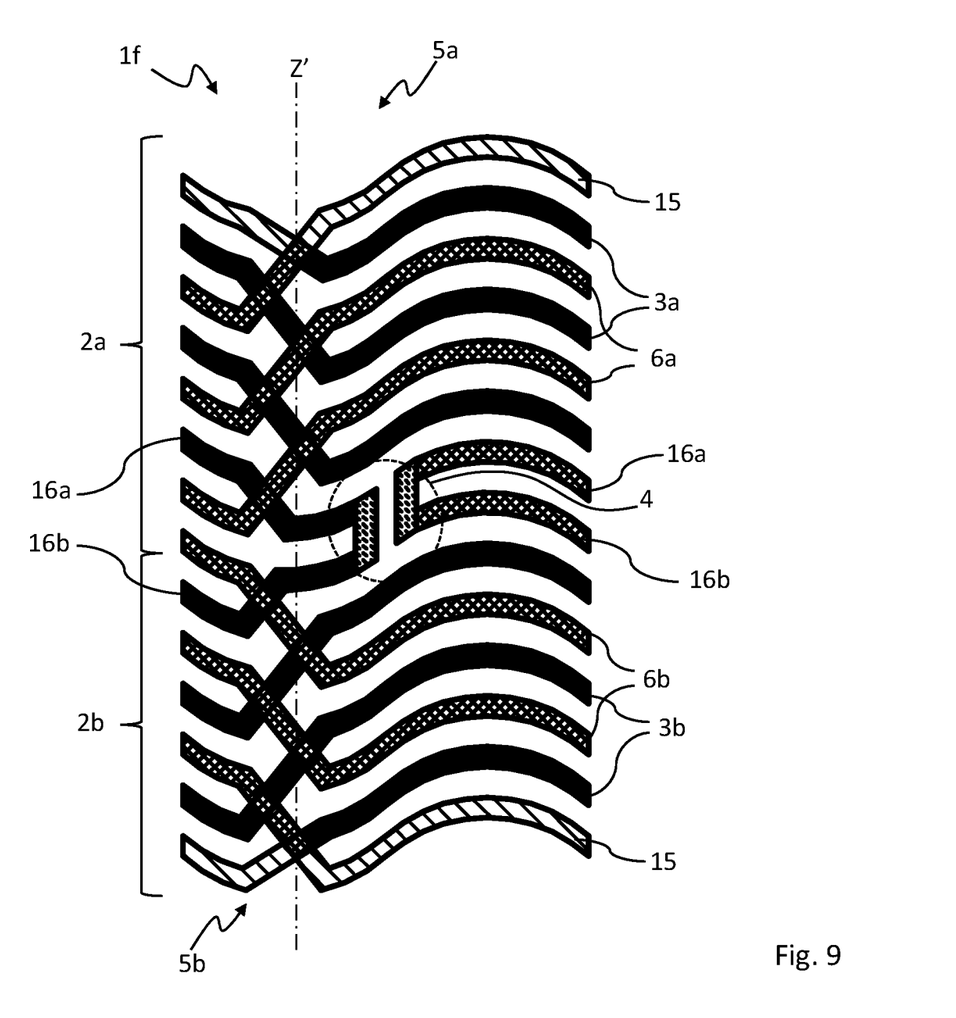
FIG. 9 shows a developed view of an embodiment of a transceiver coil for a probehead according to the invention in which the tilt of the windings relative to the longitudinal axis Z' is not equal to zero.

FIG. 9 shows a further alternative embodiment of the transceiver coil 1f, which has windings which are tilted (S≠0) relative to the longitudinal axis. In the present case, the tilt is constant–T=const. One can clearly see that the Z' values increase within a half-turn (in this case, for the forward windings, starting from the crossover region) and decrease within the other half-turn (in this case, for the forward windings ending at the crossover region), and thus constitute a sinusoidal modulation of the Z'-position.

The pitch P (with the exception of the return windings at the two axial ends 5a and 5b, and one of the connection windings) is constant over the entire transceiver coil 1f.

Such a coil is particularly advantageous when it is intended to generate HF magnetic fields that are not collinear with the cylinder axis (longitudinal axis Z' of the transceiver coil). This is particularly advantageous for a MAS-NMR measurement sample in which the cylinder axis Z' and the direction of the static magnetic field are arranged at the magic angle. With such a configuration, the efficiency of the measurement of the measurement sample can be increased by a constant tilt T(t)=const.

As in the embodiment shown in FIG. 1, the embodiment shown in FIG. 9 has two coil portions 2a, 2b with the forward windings 3a, 3b and backward windings 6a, 6b, wherein the electrical conductor leads, starting from a central connection region 4, to the axial ends 5a, 5b of the transceiver coil 1, with a prespecified winding direction and a pitch P, and then from there is routed back, with the opposite pitch P but with the same winding direction, to the central connection region 4. The tilt T can also be varied from winding to winding or from half-turn to half-turn. However, a non-zero tilt T or a variable tilt T can also be implemented in embodiments with only one coil portion.

Figure 10:
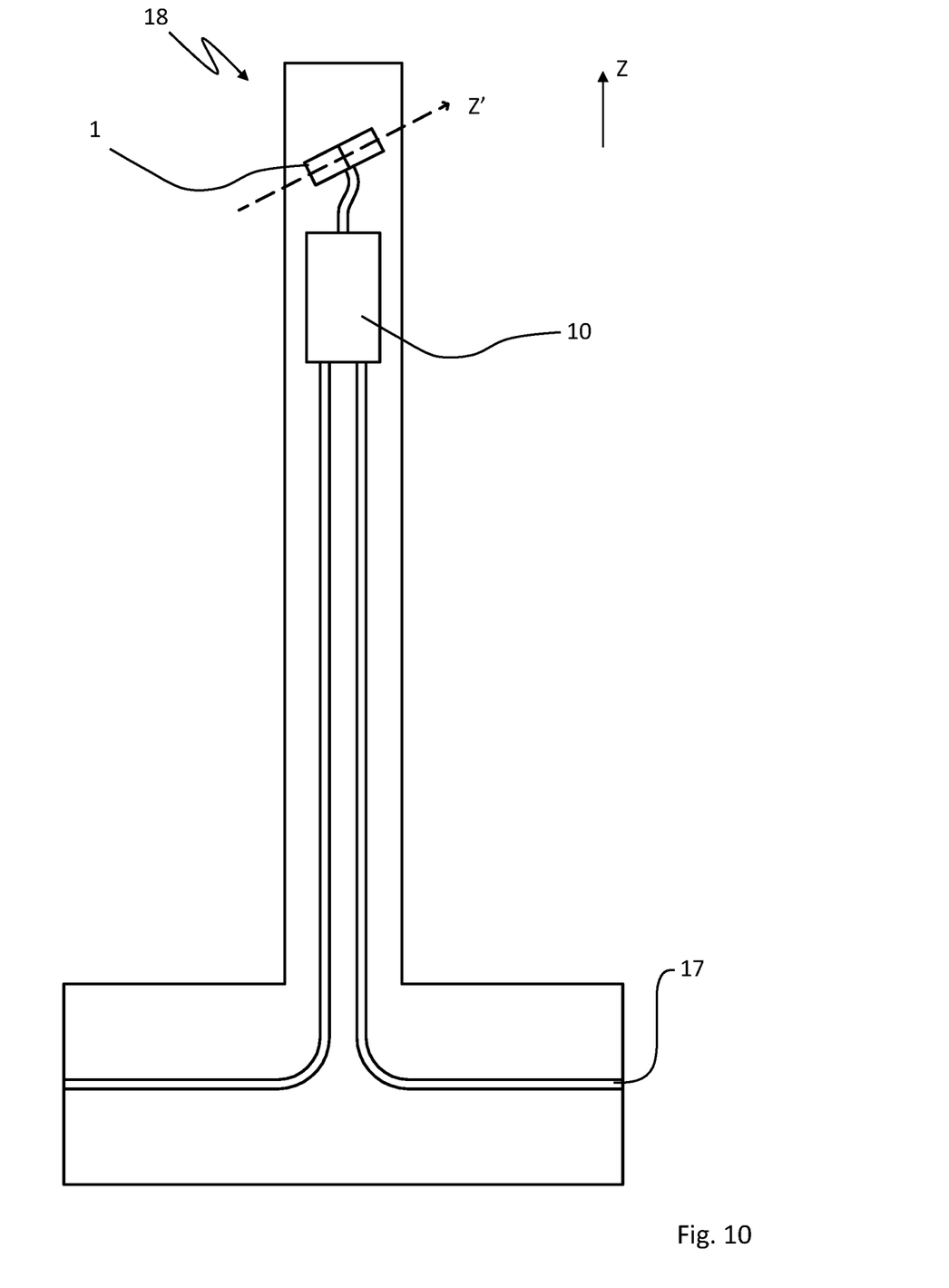
FIG. 10 shows a schematic view of an NMR probehead according to the invention.

FIG. 10 shows a schematic illustration of an NMR probehead 18 according to the invention. An external magnetic field for carrying out NMR measurements is aligned parallel to the Z-axis during operation in the example shown here. The NMR probehead 18 comprises a transceiver coil 1 according to the invention, which is connected to the matching network 10 and also a spectrometer connection 17 for each measurement channel. The NMR probehead shown in FIG. 10 is a MAS (magic angle spinning) probehead in which the longitudinal axis Z' of the transceiver coil 1 is preferably tilted at the magic angle θ (θ=54.74°) with respect to the Z-axis of the NMR probehead 18.

LIST OF REFERENCE SIGNS 1, 1a-1f transceiver coil
2, 2a, 2b coil portion
3, 3a, 3b forward windings of the coil portion
4, 4' connection region
5a, 5b axial ends of the transceiver coil
6, 6a, 6b backward windings of the coil portion
7 crossovers of the electrical conductor
8 crossover region
9 connections of the connection region 4, 4'
10 matching network
11 conductor path of the electrical conductor
12 space between windings of the transceiver coil
13 region of the coil portion with minimum conductor path widths W and maximum gap widths D
14 regions of the coil portion with maximum conductor path widths W and minimum gap widths D (further regions)
15, 15a, 15b return winding
16, 16a, 16b connection winding
17 spectrometer connection
18 NMR probehead
19 measurement sample

The invention claimed is:

1. An NMR probehead having a transceiver coil arrangement comprising at least one transceiver coil for generating an HF B1 magnetic field, the transceiver coil having a connection region and at least one electrical coil portion comprising:
   a forward winding portion with forward windings that start from the connection region and, in a prespecified winding direction, lead to an axial end of the transceiver coil, and
   a backward winding portion with backward windings that start from the axial end of the transceiver coil and, in said prespecified winding direction, lead to the connection region, wherein the windings of the backward winding portion have a pitch P of opposite sign to those of the forward winding portion,
   wherein the forward and backward windings of the electrical coil portion, with the exception of crossover regions in which the forward and backward windings cross over each other, are arranged on the same cylindrical surface about a longitudinal axis Z', and
   wherein the windings of the transceiver coil along the coil portion have a variable tilt relative to the longitudinal axis Z'.

2. The NMR probehead according to claim 1, wherein the at least one electrical coil portion further comprises a return winding that connects the forward and backward windings and at which the pitch P changes sign, the return winding having a zero potential point during operation, and wherein the forward windings and backward windings of the at least one electrical coil portion alternate in a longitudinal direction parallel to the axis Z'.

3. The NMR probehead according to claim 1, wherein the axial end is a first axial end at which the connection region is arranged, wherein the forward winding portion leads, starting from the connection region, to a second axial end of the transceiver coil, and wherein the backward winding portion leads, starting from the second axial end of the transceiver coil, to the connection region.

4. The NMR probehead according to claim 1, wherein the at least one electrical coil portion is a first electrical coil portion and the axial end of the transceiver coil is a first axial end, and wherein the transceiver coil comprises at least two electrical coil portions between which the connection region is arranged, with the forward windings of the first electrical coil portion leading from the connection region to the first axial end of the transceiver coil, and the backward windings of the first electrical coil portion leading from the first axial end of the transceiver coil to the connection region, and
   wherein forward windings of a second electrical coil portion lead from the connection region to a second axial end of the transceiver coil, and backward windings of the second electrical coil portion lead from the second axial end of the transceiver coil to the connection region.

5. The NMR probehead according to claim 1, wherein the forward and backward windings are arranged on a circular cylindrical surface.

6. The NMR probehead according to claim 1, wherein the electrical coil portions are designed as strip-shaped coil portions which have a conductor path width W.

7. The NMR probehead according to claim 6, wherein the conductor path width W of the electrical coil portion and/or a gap width D between adjacent windings of the transceiver coil varies along an axial length of the electrical coil portion.

8. The NMR probehead according to claim 7, wherein the conductor path width W of the electrical coil portion and/or the gap width D between adjacent windings of the transceiver coil varies within each winding.

9. The NMR probehead according to claim 1 wherein the pitch P of the windings varies along an axial length of the electrical coil portion.

10. The NMR probehead according to claim 9, wherein the pitch P at the axial end of the transceiver coil is smaller than at an axial center of the transceiver coil.

11. The NMR probehead according to claim 1, wherein at least one of the forward and backward windings has a slope equal to zero outside of the crossover regions.

* * * * *